US009461046B1

(12) United States Patent
Edwards et al.

(10) Patent No.: US 9,461,046 B1
(45) Date of Patent: Oct. 4, 2016

(54) LDMOS DEVICE WITH GRADED BODY DOPING

(71) Applicant: Texas Instruments Incorporated, Dallas, TX (US)

(72) Inventors: Henry Litzmann Edwards, Garland, TX (US); James Robert Todd, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/974,951

(22) Filed: Dec. 18, 2015

(51) Int. Cl.
| H01L 29/66 | (2006.01) |
| H01L 27/092 | (2006.01) |
| H01L 29/78 | (2006.01) |
| H01L 29/06 | (2006.01) |
| H01L 21/8238 | (2006.01) |

(52) U.S. Cl.
CPC ... *H01L 27/0928* (2013.01); *H01L 21/823892* (2013.01); *H01L 29/0696* (2013.01); *H01L 29/66681* (2013.01); *H01L 29/7816* (2013.01)

(58) Field of Classification Search
None
See application file for complete search history.

(56) References Cited

U.S. PATENT DOCUMENTS

| 6,593,621 | B2 | 7/2003 | Tsuchiko et al. | |
| 7,649,225 | B2* | 1/2010 | Cai | H01L 21/823425 257/343 |
| 7,713,825 | B2 | 5/2010 | Hu et al. | |
| 7,736,983 | B2 | 6/2010 | Kohli et al. | |
| 8,174,071 | B2 | 5/2012 | Tien et al. | |
| 8,581,344 | B2* | 11/2013 | Liu | H01L 29/0692 257/337 |
| 9,153,666 | B1* | 10/2015 | Iravani | H01L 29/66681 |
| 2010/0096697 | A1* | 4/2010 | Su | H01L 21/26586 257/343 |
| 2011/0303977 | A1* | 12/2011 | Huang | H01L 21/8249 257/339 |
| 2014/0206168 | A1* | 7/2014 | Yang | H01L 29/66689 438/286 |
| 2014/0284716 | A1* | 9/2014 | Ren | H01L 29/78 257/343 |
| 2015/0048452 | A1* | 2/2015 | Chen | H01L 29/7823 257/343 |
| 2015/0270388 | A1* | 9/2015 | Chan | H01L 29/1087 257/343 |
| 2015/0380398 | A1* | 12/2015 | Mallikarjunaswamy | H01L 29/7823 257/272 |
| 2016/0118495 | A1* | 4/2016 | Chen | H01L 29/7835 257/343 |

* cited by examiner

*Primary Examiner* — Alexander Ghyka
(74) *Attorney, Agent, or Firm* — Jacqueline J. Garner; Frank D. Cimino

(57) ABSTRACT

A laterally diffused MOS (LDMOS) device includes a substrate having a p-epi layer thereon. A p-body region is in the p-epi layer. An ndrift (NDRIFT) region is within the p-body region providing a drain extension region, and a gate dielectric layer is formed over a channel region in the p-body region adjacent to and on respective sides of a junction with the NDRIFT region, and a patterned gate electrode on the gate dielectric. A DWELL region is within the p-body region, sidewall spacers are on sidewalls of the gate electrode, a source region is within the DWELL region, and a drain region is within the NDRIFT region. The p-body region includes a portion being at least one 0.5 μm wide that has a net p-type doping level above a doping level of the p-epi layer and a net p-type doping profile gradient of at least 5/μm.

19 Claims, 7 Drawing Sheets

LDMOS DEVICE WITH GRADED BODY DOPING

FIELD

Disclosed embodiments relate to laterally diffused metal oxide semiconductor (LDMOS) devices.

BACKGROUND

As DC-DC converters are scaled to the next generation of power converter products, there is a need to increase the switching frequency to reduce the size of the external passive components such as inductors while maintaining low power dissipation in its integrated power field effect transistors (FETs), such as LDMOS devices. In an LDMOS device, the drain is laterally arranged to allow current to laterally flow, and a drift region is interposed between the channel and the drain to provide a high drain to source breakdown voltage. Increasing the switching frequency involves reducing the diode reverse recovery (Drr) time of the power FET.

Drr is a function of reverse recovery charge (Qrr) which is the amount of minority carrier charge stored in the body region of a power FET during commutation. Commutation is when an inductive converter load is forcing current into the body diode of the power FET, for an n-channel power FET resulting in the p-type body region being flooded with minority carriers (electrons). The diode recovery current's time integral is Qrr. High Qrr can cause a variety of problems, including (1) activating parasitic body NPN bipolar paths during drain voltage ramps, which can cause power dissipation or in an extreme case thermal failure of the power FET and (2) body diode induced current dissipation which can result in reduced efficiency of the switching circuit.

Conventional power LDMOS devices are n-channel devices that employ p-type body regions having a fairly uniform doping profile in the vertical direction. Some of the body doping generally comes from the p-type epitaxial silicon, which has essentially uniform boron doping. Additional p-type body doping can come from a high energy (near-MeV or MeV) p-type (e.g., boron) buried layer (PBL) implant that is subject to subsequent high temperature furnace processing, and as a result diffuses the as-implanted largely Gaussian boron dopant profile in the vertical direction so that the variation in p-type doping across the LDMOS body region in the vertical direction is substantially gradual. For example, for known LDMOS devices the p-body region may be 4 μm deep and have at most a 12 times (×) doping variation from the top (silicon surface) to bottom of the body region that is distributed in an essentially constant vertical dopant concentration gradient. The essentially constant vertical dopant concentration gradient is typically about 2× to 3×/μm at most where being above the doping level of the p-epi region through any 0.5 μm or more wide region of the body.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include laterally diffused metal oxide semiconductor (LDMOS) devices and processes for forming such devices that enables the reduction of the reverse recovery charge (Qrr), which can also enable a decrease in area-normalized ON-state resistance (RSP). As used herein, an LDMOS device is synonymous with a diffused metal oxide semiconductor (DMOS) device. Historically, as described above, conventional processing for LDMOS power devices has used long/high temperature furnace anneals with high energy near-MeV or MeV boron implants to achieve a gradual or nearly uniform vertical p-body doping profile, with a vertical body doping concentration (C) gradient (dC/dz) that is small, e.g., at most 2× to 3×/μm where above the doping level of the p-epi region through any 0.5 μm or more wide region.

Disclosed embodiments recognize as a result of the gradual or nearly uniform conventional body doping profile, the minority carriers (electrons) injected into the body during a switching event are held therein for a relatively long time (known as the diode storage time). During the diode storage time the electrons leave the body region by diffusion, to be collected at the nearest reverse-biased junction (NBL, drain), or with reduced collection efficiency at a grounded junction (NBL, source). The diode storage time can be estimated using the base transit time from an NPN bipolar transistor. Consider an NPN transistor body with boron (base) doping of $\sim 1 \times 10^{17}$ cm$^{-3}$. The room temperature electron diffusion coefficient at this doping level is 21 cm$^2$/s, resulting in a base transit time of 6 ns for a 5 μm wide (thick) body region, or 1 ns for a 2 μm wide body region. It is not uncommon to encounter p-type body regions of several μms in thickness (e.g. 3 μm to 5 μm thick) in integrated power LDMOS devices, so it is expected that Qrr-related transients will occur on the order of ns, which is in fact what has been observed by the Inventors of this Disclosure.

For a DC-DC converter switching in the MHz range, ns-scale switching transients can quickly deteriorate the power conversion efficiency, where power conversion efficiencies above 80% or even 90% are considered important power product performance metrics. A technology to reduce diode recovery time and hence reduce the impact of Qrr is recognized as being desirable, which is provided by disclosed methods and LDMOS devices therefrom having a graded body doping. As used herein, a "graded body doping" refers to a net boron doping profile with a dopant gradient of at least a factor of 5×/μm in a vertical direction (dC/dz) in a body portion being at least one 0.5 μm wide that has a net doping level above that of the p-epi layer 115. Disclosed graded body doping may be compared to the significantly lower dC/dz for the boron in the body region from 2× to 3×/μm where above the doping level of the p-epi region through any 0.5 μm or more wide region for a conventional LDMOS device as described above.

BRIEF DESCRIPTION OF THE DRAWINGS

Reference will now be made to the accompanying drawings, which are not necessarily drawn to scale, wherein.

DETAILED DESCRIPTION

Figure 1:
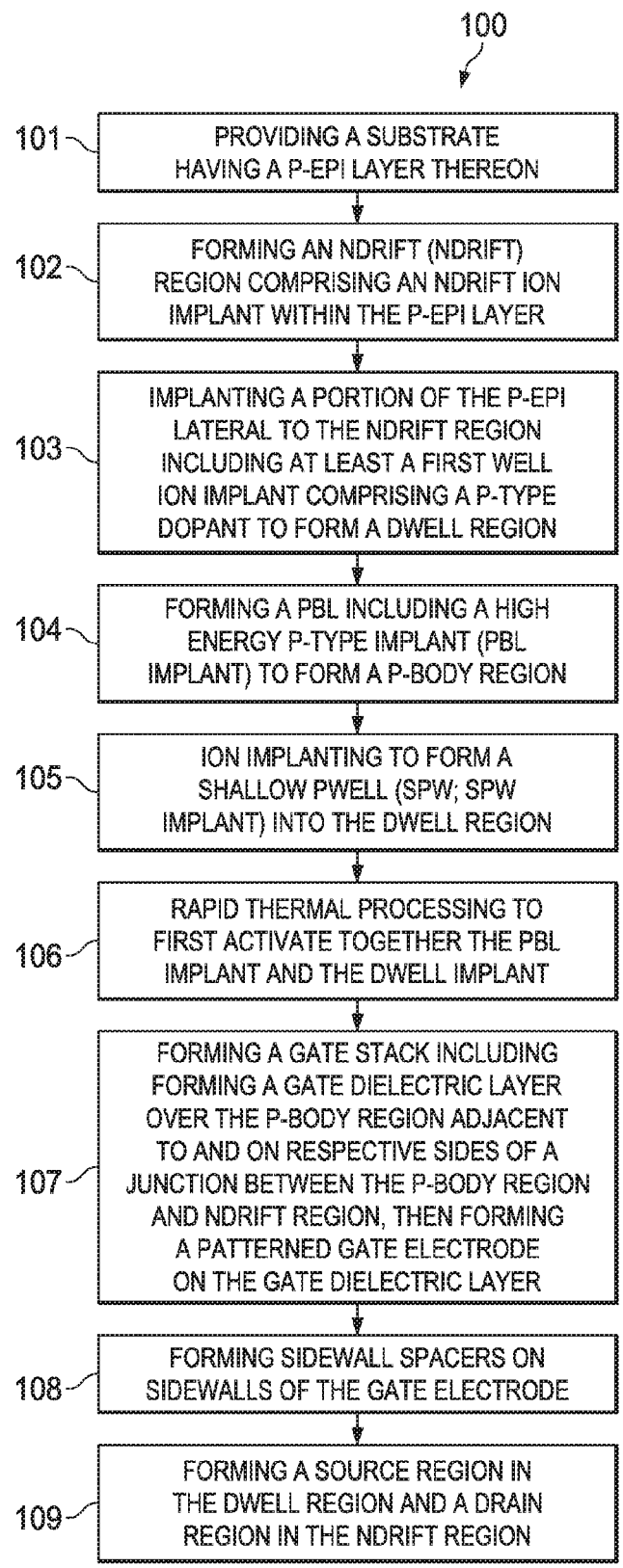
FIG. 1 is a flow chart that shows steps in an example method for forming a disclosed LDMOS device having graded body doping in the vertical direction, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed embodiments include LDMOS fabrication processes having a new p-body process flow which provides a graded body doping profile, and LDMOS devices therefrom. FIG. 1 is a flow chart that shows steps in an example method 100 for forming a disclosed LDMOS device with a graded body doping profile, according to an example embodiment. Method 100 is described using BiCMOS process flow which as known in the art combines bipolar and CMOS technology. Although NMOS LDMOS transistors are described herein, it is clear to one having ordinary skill in the art to use this information to form PMOS transistors, by n-doped regions being substituted by p-doped regions and vice versa.

Method 100 includes a new p-buried layer (PBL) process in which the PBL high energy (e.g., 400 keV to 2 MeV) boron implant is carried out after all of the significant thermal steps are completed (i.e., furnace cycles such as ≥900° C. drives for ≥30 minutes (e.g., shallow trench isolation (STI) liner anneal, deep nwell (DNWELL) drive) thus having significant DT, where DT is the thermal diffusion coefficient with D being the diffusion coefficient and T the temperature in the process flow. This results in leaving a body doping profile in the final LDMOS device that has steeply graded body regions which still reflect the as-implanted dopant profile which is an approximate Gaussian distribution with Rp being the "projected range" of the p-type ion. The steep body doping gradient in the final LDMOS device is recognized to result in a built-in electric field (due to a significant conduction band energy (Ec) tilt, with the gradient of the electric field E=dEc/dz) in the vertical/thickness direction, which provides an electrical force that sweeps the minority carrier electrons towards a neighboring pn junction efficiently so that it occurs significantly more rapidly.

Figure 4:
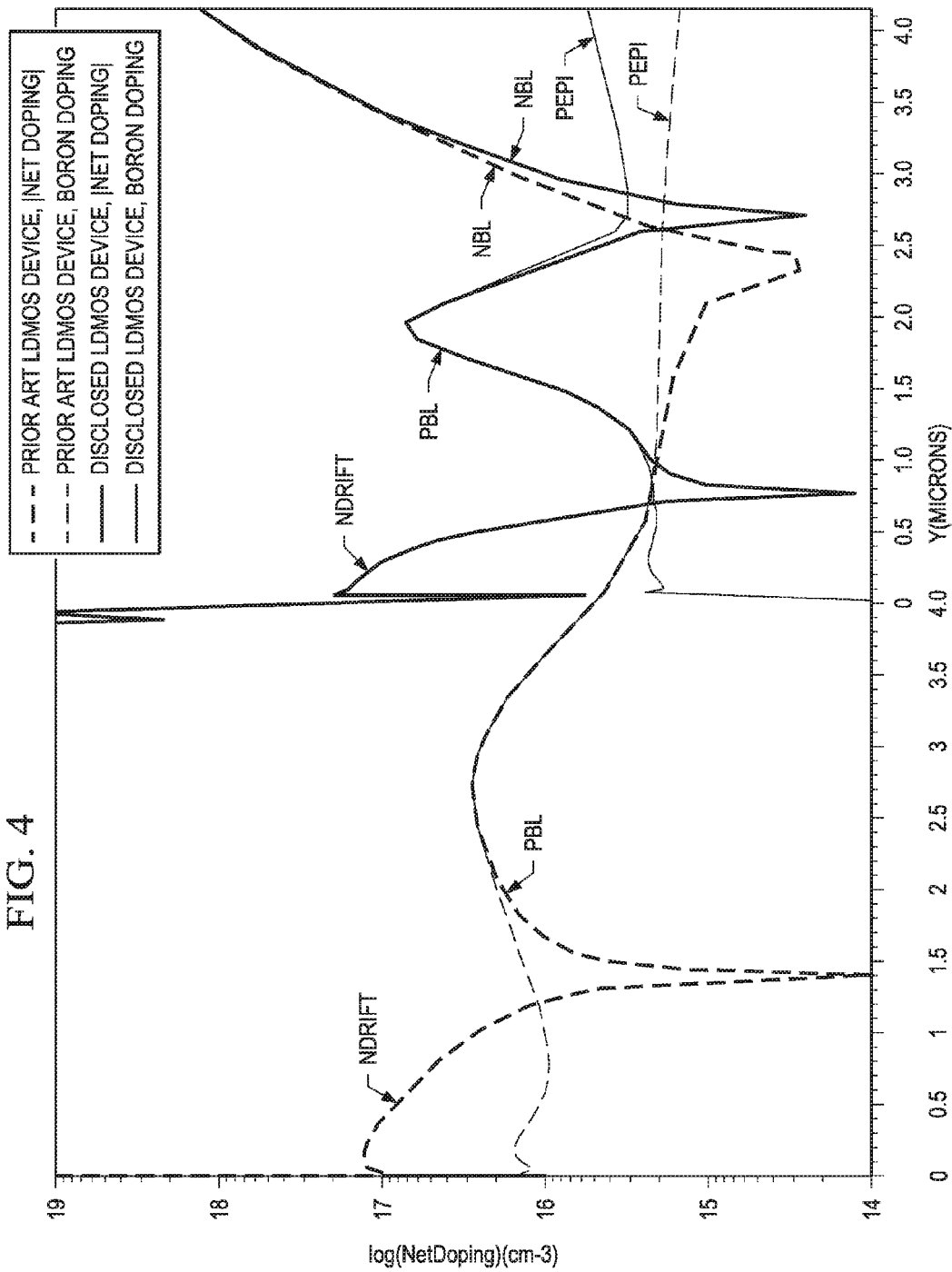
FIG. 4 shows the doping level as a function of distance in the vertical direction beginning from the top silicon surface of the NDRIFT region for a known LDMOS device with a conventional substantially flat body doping profile, and the doping level as a function of distance in the vertical direction beginning from the top silicon surface of the NDRIFT region of a disclosed LDMOS device with a graded body doping profile in the vertical direction according to an example embodiment.

Using a disclosed body doping gradient is sufficient to essentially remove "flat" or substantially uniformly doped regions in the p-type body of the LDMOS device. For example, see a disclosed LDMOS device with a graded body doping profile vs. a known LDMOS device with a conventional substantially flat body doping profile as shown in FIG. 4. The graded body doping profile has been found to accelerate the Qrr diode recovery transient and avoid the power loss and parasitic NPN turn ON that can happen when the minority carrier extraction takes longer times.

There are additional advantages that come along with disclosed LDMOS devices having disclosed graded body doping profiles. Because the PBL is essentially not diffused following its implant, the PBL dose can be increased without increasing near-top semiconductor surface body doping, which allows the gain of the vertical parasitic NPN to be suppressed, further improving the safe operating area (SOA) for the LDMOS device. The built-in E field due to the graded body doping profile resists minority carrier electron injection, which tends to reduce the total number of minority carrier electrons injected during switching events during power converter operation, thus reducing the magnitude of Qrr that reduces reverse recovery time, improving switching efficiency and the SOA of the LDMOS device.

Step 101 comprises providing a substrate 110 having a p-epi layer 115 thereon. The p-epi layer 115 may be about 15 μm to 40 μm thick. The process can comprise forming a first epi layer on the substrate, forming a blanket n+ buried layer (NBL) 111, and then forming a second epi layer over the NBL 111. The substrate 110 is generally a p+ or p− substrate, typically boron doped from $1 \times 10^{16}$ to $1 \times 10^{19}$ cm$^{-3}$, and the p-epi layer 115 can have a doping level from $3 \times 10^{14}$ cm$^{-3}$ to $3 \times 10^{16}$ cm$^{-3}$. The substrate 110 and the p-epi layer 115 can both comprise silicon, and can also comprise other materials.

Disclosed LDMOS devices can include an isolation structure. For examples, an outer n-type tank can be formed in several ways. A deep trench (DT) is one example having an optional dielectric liner and NBL, DEEPN and NBL, DNWELL and NBL, or shallow nwell (SNW), BISO, and NBL. BISO is a phosphorus implant performed before the second epi process (in a two epi process) at the edges of the NBL (but after the NBL furnace drive which diffuses the NBL deeper into the Si). The BISO diffuses up into the second p-epi, enabling an n-tank connection to be established with SNW for example, hence avoiding the use of a DEEPN which is sometimes desirable. In all of these cases, the NBL forms the bottom of the n-type tank and the other element (DT, DEEPN, etc.) forms the vertical walls of the n-tank that connect up to the top surface, such a top surface having n+(from the NSD), silicide and contacts.

Step 102 comprises forming an ndrift (NDRIFT) region 120 comprising an NDRIFT ion implant within the p-epi layer 115. There is an option for an NDRIFT driving process. The NDRIFT region 120 provides the drain extension region for the LDMOS device 200 shown in FIG. 2A. For LDMOS device 200 a local oxidation process follows to form LOCOS layer 137. However, as shown in FIG. 3, in other embodiment the LDMOS device is a "planar" device that lacks a LOCOS layer 137.

Step 103 comprises implanting a portion of the p-epi layer 115 lateral to the NDRIFT region 120 including at least a first well ion implant comprising a p-type dopant generally described as being boron (boron DWELL ion implant) to form a DWELL region (DWELL) 130. However, besides boron the p-type dopant can be indium. Indium (In) being a relatively heavy atom has the advantage of a low diffusion coefficient relative to boron. In the case of a boron implant, the DWELL boron implant can be similar in energy to the PSD and PLDD2 steps in a BiCMOS process and the dose used should generally be sufficient to form a channel laterally and to suppress body NPN effects. For example, a boron implant with an energy of 20 keV, a dose of $8 \times 10^{13}$ to $3.0 \times 10^{14}$ cm$^{-2}$, such as $1.5 \times 10^{14}$ cm$^{-2}$, and a tilt angle of less than 5 degrees, such as 2 degrees, may be used.

An optional DWELL n-type dopant such as arsenic or antinomy can also be added at the same mask for the boron DWELL ion implant, with the arsenic and p-type Dwell implants being in either order. For example, arsenic with a dose $5 \times 10^{13}$ cm$^{-2}$ to $1.2 \times 10^{15}$ cm$^{-2}$ (e.g., $8 \times 10^{14}$ cm$^{-2}$) an energy 10 to 30 keV (e.g., 15 keV), and a 15 degree ion implant tilt angle may be used in one particular embodiment for the DWELL n-type dopant, or some or all of this implant angled at for example 45 degrees (2 or 4 rotations). The implant angle can also be straight as well (at 0 degrees) or zero to 15 degrees. An arsenic energy of about 15 keV can allow the arsenic to penetrate through the gate dielectric 122 (e.g., when a 5V oxide is used for gate dielectric 122) adjacent to the gate electrode 123 which reduces the net doping concentration there by counter doping so as to reduce gate-induced parametric shifts. The 15 degree or so arsenic implant angle can reduce the channel voltage threshold (Vt) without reducing the DWELL p-type implant dose, enabling the simultaneous improvement of Vt and control of the body doping of the parasitic NPN.

Step 104 comprises forming a PBL including a high energy p-type implant (PBL implant) to add doping to the p-epi layer to form a p-body region. The PBL implant can comprise a boron dose from $1 \times 10^{12}$ cm$^{-2}$ to $1 \times 10^{13}$ cm$^{-2}$, at an energy of 400 keV to 3 MeV. As noted above Indium may also be used. For low voltage LDMOs devices (e.g., 20V), the PBL implant can be a blanket implant, while for higher voltage LDMOS devices (e.g., >30V) the PBL implant can be a masked implant to allow selective placement.

Step 105 comprises ion implanting to form a shallow pwell (SPW; SPW implant) into the DWELL 130. Step 105 can comprise 2 or more SPW implants all at different energies. The region shown in FIG. 2A as SPW1 149 is a part of the SPW, and can be from a BiCMOS process utilizing the conventional shallow p-body implant used to form the CMOS logic and 5V NMOS body diffusions which may both be optionally be implanted for the LDMOS device to form a deep p-body doping region for the LDMOS device. The body doping provided by SPW1 149 increases the base doping level to suppress the parasitic lateral NPN bipolar formed by n+ source-p-body-n+ drain. This parasitic NPN limits high current operation for LDMOS device 200 as it forms a boundary to the safe operating area (SOA). The SNW which is optional is shown as SNWell 155 in FIG. 2A.

Step 106 comprises Rapid Thermal Processing to first activate together the PBL implant, the DWELL implant (if not optionally driven earlier), and the SPW implant. Rapid Thermal Processing (RTP) as used herein refers to a semiconductor manufacturing process which heats semiconductor (e.g., silicon) wafers to high temperatures (at least 950° C.) on a timescale of less than 5 minutes, typically being several seconds or less. During cooling, the wafer temperatures is brought down slowly to prevent dislocations and wafer breakage due to thermal shock. Such rapid heating rates are often attained by high intensity lamps or lasers. Rapid thermal anneal (RTA) and is a subset of RTP and Flash Lamp Annealing are examples of RTP. For example, a RTA at about 1,000° C. for 1 to 4 minutes may be used for step 106 in one particular embodiment.

Step 107 comprises forming a gate stack including forming a gate dielectric layer 122 over the p-body region 140 adjacent to and on respective sides of a junction between the p-body region 140 and NDRIFT region 120, then forming a patterned gate electrode 123 on the gate dielectric layer 122. The gate dielectric layer 122 can be a 5V gate dielectric comprising silicon oxide, which is about 10 to 15 nm thick. It is also possible to use a gate dielectric as thin as 3 nm of silicon dioxide (or a silicon oxynitride (SION) gate dielectric that is slightly thinner but with a higher dielectric constant than that of silicon dioxide which is about 3.9). Polysilicon is one example gate electrode material for the gate electrode 123. However, a metal gate or CMOS-based replacement gate process can also be used to provide the gate electrode 123.

Step 108 comprises forming sidewall spacers 138 on sidewalls of the gate electrode. The thin layer of the spacer material is also optionally shown on top of the gate electrode 123. The spacer material being on top of the gate electrode 123 may or may not be present. A pre-metal dielectric (PMD) 139 is shown including over the spacers 138.

In one embodiment the sidewall spacers comprise silicon nitride. Step 109 comprises forming a source region 148 in the DWELL 130 and a drain region 145 in the NDRIFT region 120. Contact (e.g., optional silicide, premetal dielectric, and vias) and metallization processing generally follow.

There are generally three different types of LDMOS devices for power converter applications, such as for a Half-Bridge Buck DC/DC Converter in one particular application. A low-side LDMOS transistor has the source and body region tied to ground, so such LDMOS devices can operate in the p-epi 115 without any isolation (i.e., no deep trench (DT), no NBL, and no DEEPN sinker). Another LDMOS device is an ISO LDMOS transistor built into an n-type tank. The ISO terminal is the n-tank, and it can be biased separately from the source/backgate region and the drain. Yet another LDMOS device for high side applications is built similar to the ISO LDMOS transistor, but the ISO and drain are tied together electrically (usually through metal 1 (MET1)). For each of these types of LDMOS devices there is generally a need to increase the switching frequency to reduce the size of the external passive components such as inductors while maintaining a low power dissipation in the integrated power FETs. This involves reducing the switching parasitics Qgate and Cdrain of the power FET while the ON-state resistance RSP is being reduced, that disclosed LDMOS devices provide.

Figure 2A:
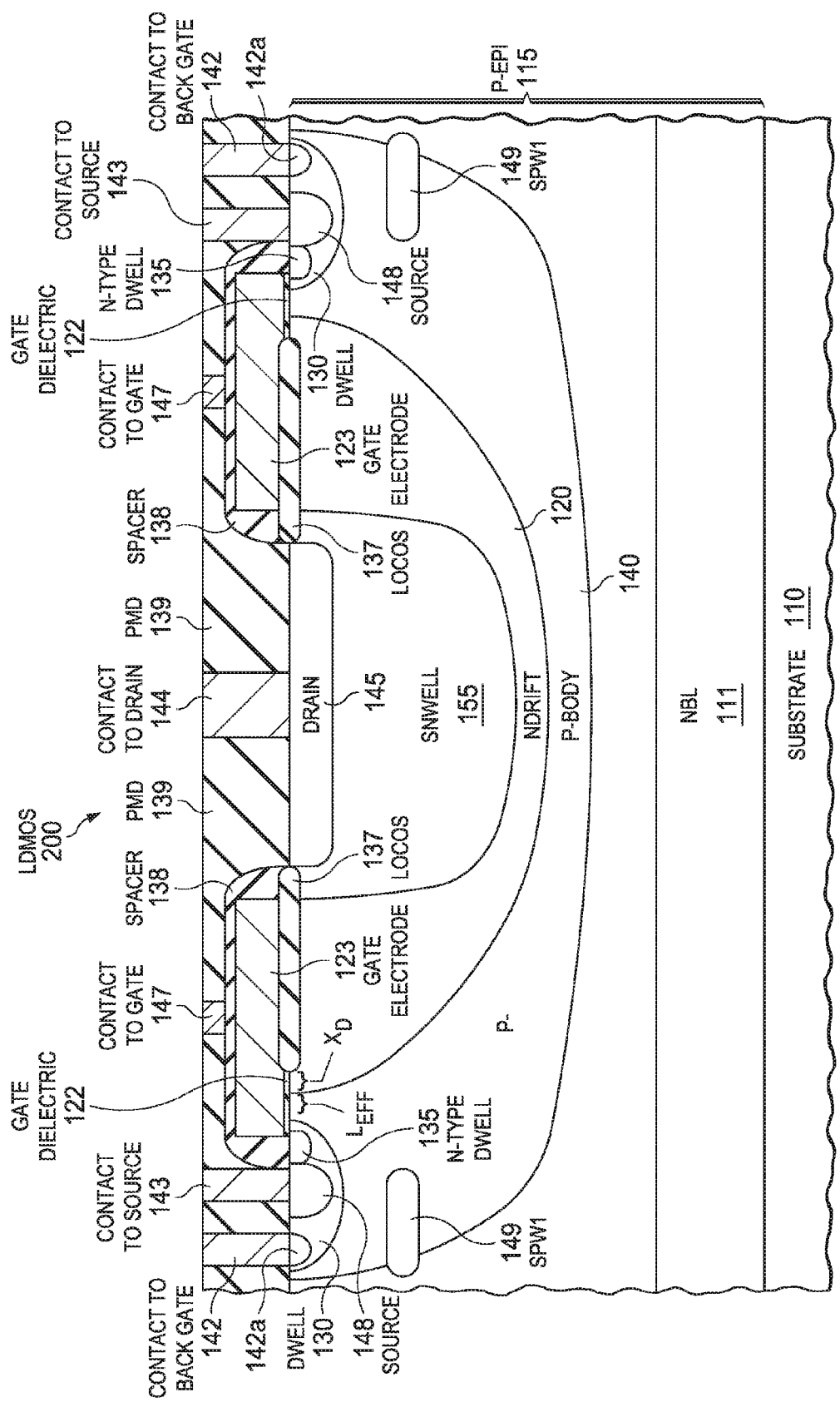
FIG. 2A is a cross-sectional diagram showing an example LDMOS device having graded body doping in the vertical direction with a gate electrode having a portion overlapping a LOCal Oxidation of Silicon (LOCOS layer), according to an example embodiment.
Figure 2B:
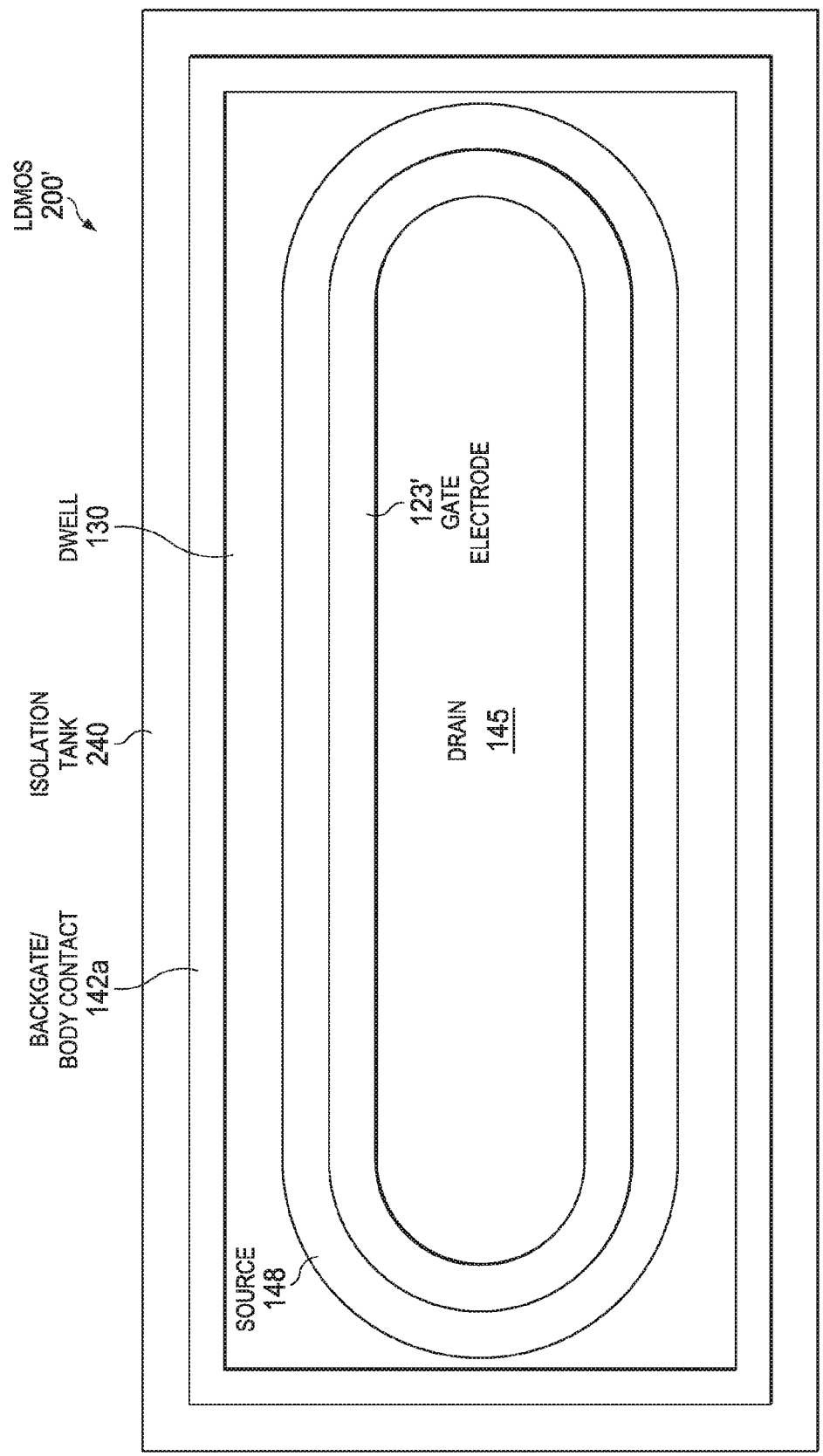
FIG. 2B is a top view of example LDMOS device having graded body doping in the vertical direction, where the gate electrode is in a racetrack configuration, according to an example embodiment.
Figure 3:
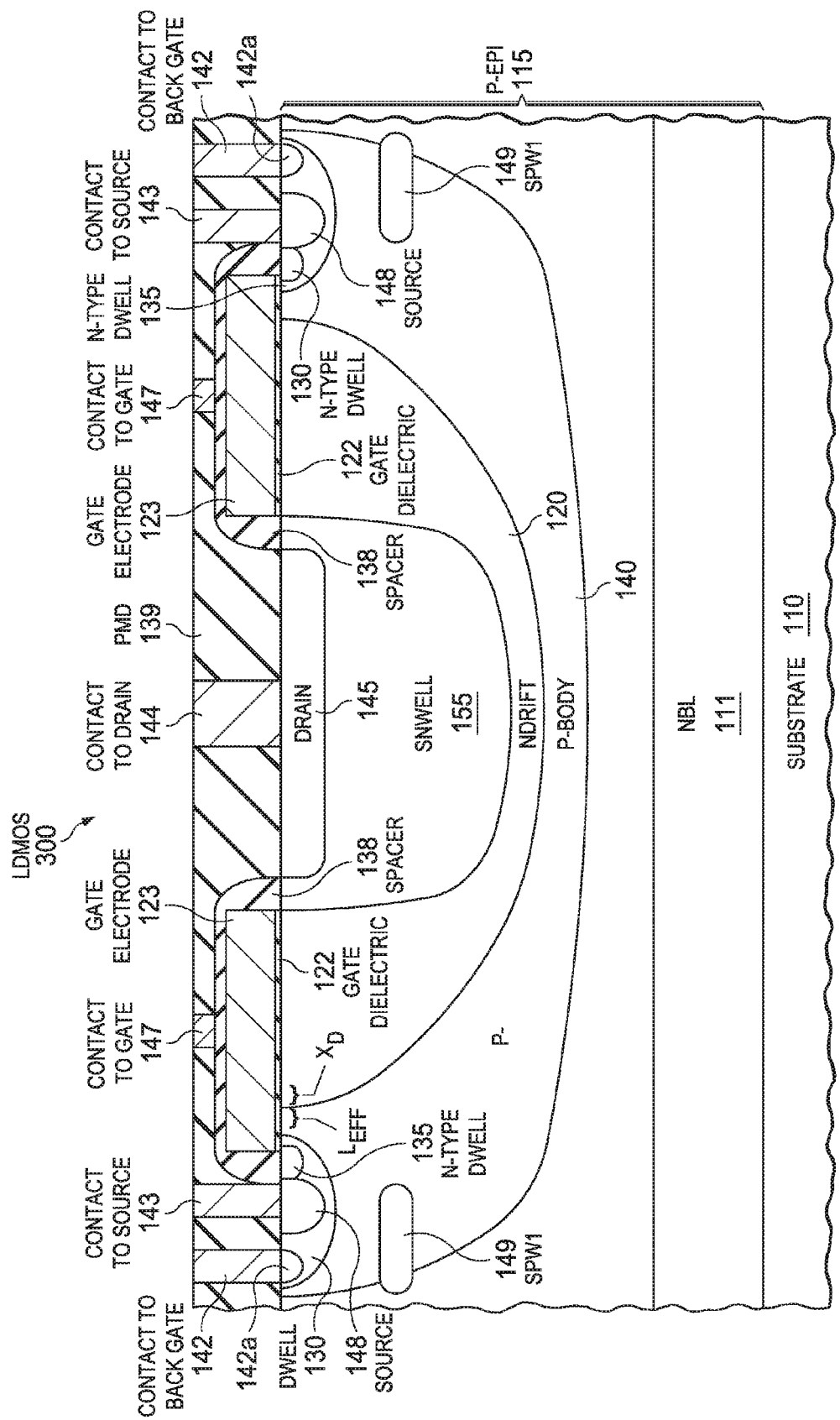
FIG. 3 shows a planar version of a disclosed LDMOS device (no LOCOS layer) having graded body doping in the vertical direction, according to an example embodiment.

FIG. 2A is a cross-sectional diagram showing an example LDMOS device having a graded body doping profile, according to an example embodiment. FIG. 2B is a top view of example LDMOS device 200' having a graded body doping profile, where the gate electrode is in a racetrack configuration, according to an example embodiment. An isolation tank 240 is shown framing LDMOS device 200' which as described above can comprise an NBL together with an n+ sinker providing vertical walls coupling a top surface of the p-epi 115 to the NBL 111. The backgate/body contact region 142a under backgate/body contact 142 is an integrated backgate contact, which is at the surface of the DWELL 130. The backgate/body contact region 142a can be formed within the DWELL 130 by adding a p+ SD (PSD) implant used for the CMOS section, which is very heavily (p+, boron) doped. One arrangement has a plurality of backgate PSD stripes or squares in the conventional geometries, with an NSD implant covering areas of the source/backgate region not covered with the PSD for low resistance contact to the source 148. Backgate/body contact region 142a allows the p-type body region (DWELL 130 and p-body 140) to be ohmically shorted to the n+ source 148 through a silicide layer. A source contact 143, drain contact 144, and gate contact 147 are also shown in FIG. 2A.

FIG. 3 shows a planar version of a disclosed LDMOS device (no LOCOS layer 137 shown in FIG. 2A) having a graded body doping profile, according to an example embodiment. The dielectric thickness of the gate dielectric 122 under the gate electrode 123 is essentially constant for LDMOS device 300. The p-type source-drain implant (PSD) for the CMOS circuitry may be optionally patterned to provide the back-gate/body contact (formed adjacent to the NSD+ DWELL region to reduce the base resistance of the p-body of the parasitic NPN, further suppressing body NPN action. The DWELL mask may optionally extend across the backgate/body contact 142a or it may stop adjacent to the PSD edge. The PLDD2 (a pure p-type SD extension implant used to form 5V PMOS) may optionally also be added to the backgate/body contact 142a, optionally extending partway into the n-type DWELL 135 in FIG. 2A to reinforce the p-type body doping, thus further suppressing body NPN action.

EXAMPLES

Disclosed embodiments are further illustrated by the following specific Examples, which should not be construed as limiting the scope or content of this Disclosure in any way.

FIG. 4 shows doping as a function of distance in the vertical direction beginning from the top silicon surface of the NDRIFT region for a known LDMOS device with a conventional body doping profile, and doping as a function of distance in the vertical direction beginning from the top silicon surface of the NDRIFT region of a disclosed LDMOD device with a graded body doping profile in the vertical direction according to an example embodiment. The doping in PBL region for the known LDMOS device can be seen to be nearly constant, while the doping in PBL region for the disclosed LDMOS device can be seen to be relatively sharply graded. For example, near the PBL peak, the dopant gradient for the disclosed LDMOS device can be seen to be near 10× in a 1 µm range about the PBL peak.

Figure 5A:
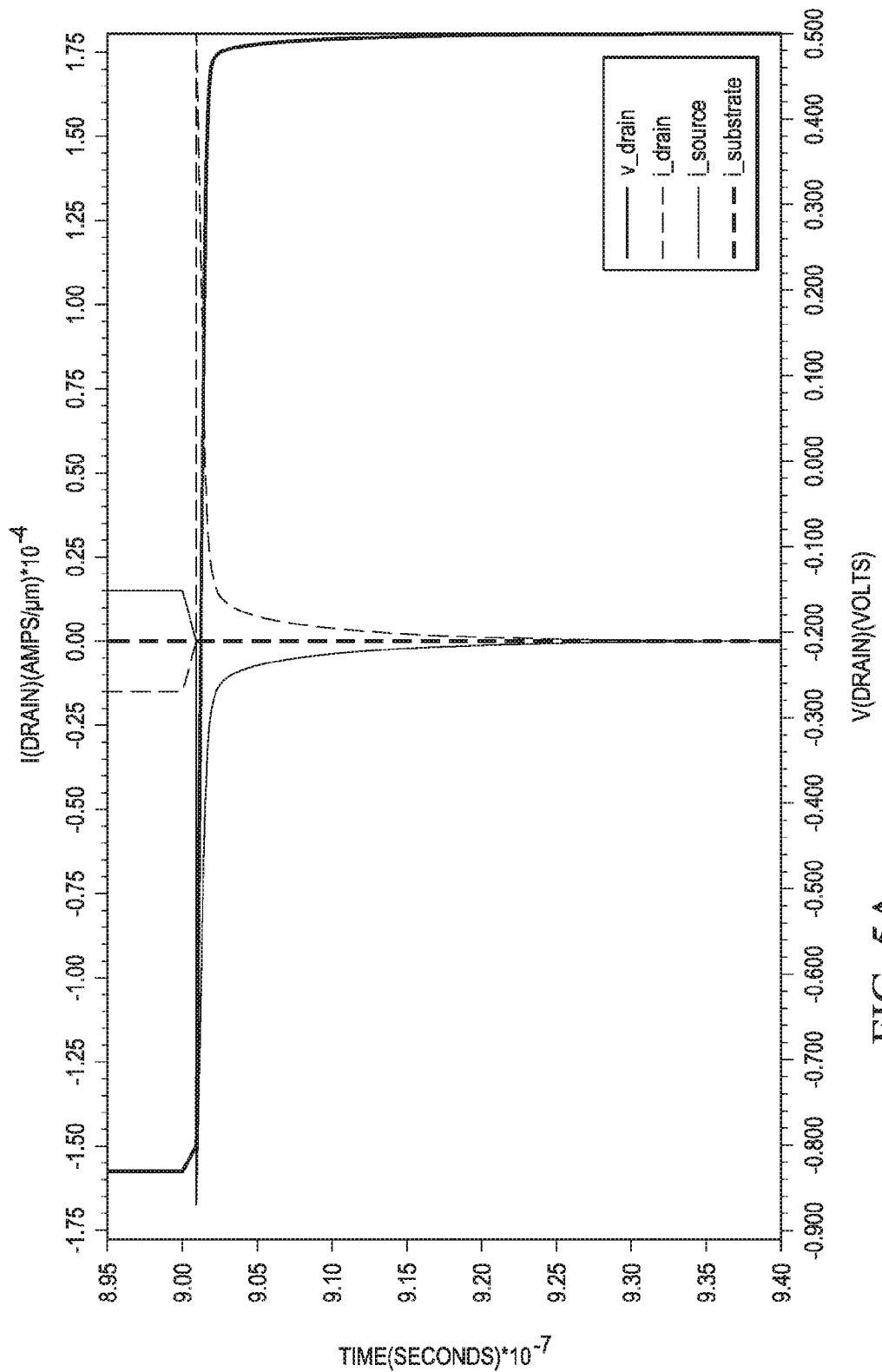
FIGS. 5A and 5B show results from time-series Technology Computer Aided Design (TCAD) simulation of a reverse recovery event for a known LDMOS device having a conventional substantially flat body doping profile and a disclosed LDMOS device having graded body doping, respectively.
Figure 5B:
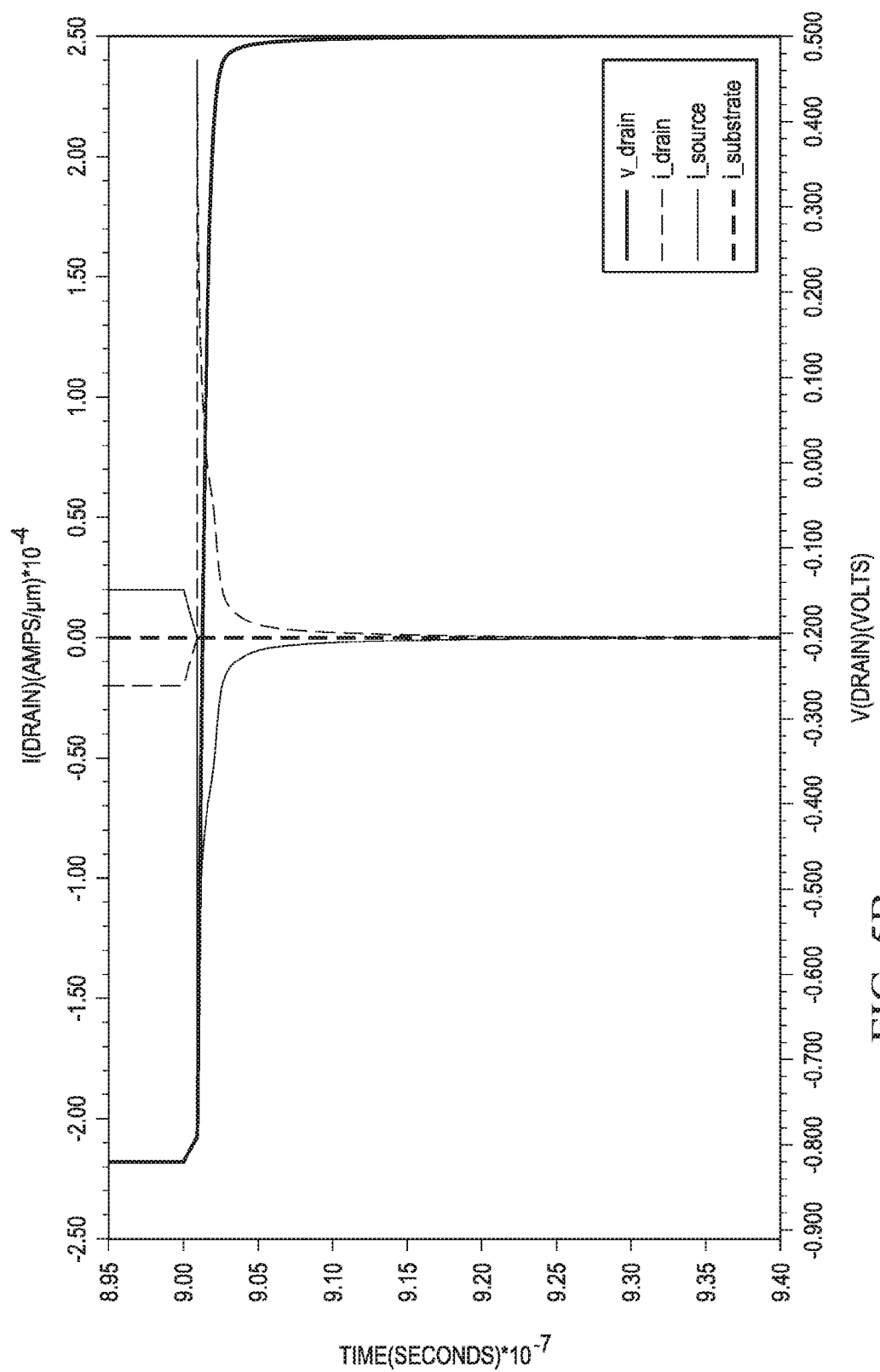

FIGS. 5A and 5B show results from time-series simulations of a reverse recovery event for a known LDMOS device having a conventional substantially flat body doping profile and a disclosed LDMOS device having graded body doping profile, respectively. A simulated forward bias current was injected into each LDMOS device (which floods the p-body region with minority carrier electrons) which is then suddenly switched off. After switching off the forward bias injection current, a reverse current begins to flow as the electrons in the p-body diffuse back towards the drain and cross the pn junction. This is the diode recovery current evidenced by I_drain, whose time integral is referred to as the reverse recovery charge Qrr. The disclosed LDMOS device having graded body doping can be seen to provide significantly lower recovery current and thus improve Qrr performance compared to the known LDMOS device whose Qrr comes out significantly more slowly as compared to the disclosed LDMOS device.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of forming a laterally diffused metal oxide semiconductor (LDMOS) device, comprising:
providing a substrate having a p-epi layer thereon;
forming an ndrift (NDRIFT) region including NDRIFT ion implanting within said p-epi layer;
implanting a portion of said p-epi layer lateral to said NDRIFT region including at least a first well implant comprising a p-type implant (p-type DWELL implant) to form a DWELL region;
forming a p-buried layer (PBL) including a high energy implant PBL implant to add doping to said p-epi layer to form a p-body region;
implanting at least one shallow pwell implant (SPW implant) into said DWELL region;
Rapid Thermal Processing (RTP) to first activate together at least said PBL implant and said SPW implant;
forming a gate stack including forming a gate dielectric layer over a channel region in said p-body region adjacent to and on respective sides of a junction with said NDRIFT region then a patterned gate electrode on said gate dielectric layer,
forming sidewall spacers on sidewalls of said gate electrode;
forming a source region within said DWELL region and a drain region within said NDRIFT region,
wherein said p-body region includes a portion being at least one 0.5 µm wide that has a net p-type doping level above a doping level of said p-epi layer and a net p-type doping profile gradient of at least a factor of 5/µm.

2. The method of claim 1, wherein said DWELL implant is performed before forming said gate stack.

3. The method of claim 1, wherein said PBL implant comprises boron in a dose from $1 \times 10^{12}$ cm$^{-2}$ to $1 \times 10^{13}$ cm$^{-2}$, at an energy of from 400 keV to 3 MeV.

4. The method of claim 1, further comprising a second well ion implant comprising implanting an n-type dopant into said DWELL region to form an n-type DWELL region.

5. The method of claim 1, wherein said PBL implant comprises an indium (In) implant.

6. The method of claim 4, wherein said second well ion implant comprises arsenic with energy from 10 to 30 keV and a dose from $3 \times 10^{13}$ cm$^{-2}$ to $1.2 \times 10^{15}$ cm$^{-2}$.

7. The method of claim 1, wherein said RTP comprises a rapid thermal anneal (RTA).

8. The method of claim 1, further comprising forming an isolation tank comprising forming an n+ buried layer (NBL) in said p-epi layer before forming said NDRIFT region, and an n+ sinker providing vertical walls coupling a top surface of said p-epi layer to said NBL.

9. The method of claim 1, further comprising forming a local oxidation (LOCOS) layer over a portion of said NDRIFT region, wherein said gate electrode is on an adjacent portion of said LOCOS layer.

10. The method of claim 1, wherein said PBL implant comprises a blanket implant.

11. A laterally diffused metal oxide semiconductor (LDMOS) device, comprising:
   a substrate having a p-epi layer thereon;
   a p-body region in said p-epi layer;
   an ndrift (NDRIFT) region within said p-body region to provide a drain extension region;
   a gate stack including a gate dielectric layer over a channel region in said p-body region adjacent to and on respective sides of a junction with said NDRIFT region and a patterned gate electrode on said gate dielectric,
   a DWELL region within said p-body region;
   sidewall spacers on sidewalls of said gate electrode, and
   a source region within said DWELL region and a drain region within said NDRIFT region,
   wherein said p-body region includes a portion being at least one 0.5 µm wide that has a net p-type doping level above a doping level of said p-epi layer and a net p-type doping profile gradient of at least a factor of 5/µm.

12. The LDMOS device of claim 11, wherein said substrate comprises silicon.

13. The LDMOS device of claim 11, wherein said portion of said p-body region comprises indium (In).

14. The LDMOS device of claim 11, wherein said gate dielectric comprises silicon oxide or silicon oxynitride (SiON) and said gate electrode comprises polysilicon.

15. The LDMOS device of claim 11, further comprising an isolation tank comprising an n+ buried layer (NBL) in said p-epi layer and an n+ sinker providing vertical walls coupling a top surface of said p-epi layer to said NBL.

16. The LDMOS device of claim 11, further comprising a local oxidation (LOCOS) layer over a portion of said NDRIFT region, wherein said gate electrode is on an adjacent portion of said LOCOS layer.

17. The LDMOS device of claim 11, wherein said LDMOS device is a planar device.

18. The LDMOS device of claim 11, wherein said gate electrode is gate laid out in a racetrack geometry.

19. The LDMOS device of claim 11, further comprising an integrated backgate/body contact region at a surface of said Dwell region.

* * * * *